US012810413B2

(12) United States Patent
Kim et al.

(10) Patent No.: US 12,810,413 B2
(45) Date of Patent: Nov. 24, 2026

(54) OVERLAY MEASUREMENT DEVICE AND OVERLAY MEASUREMENT METHOD

(71) Applicant: SAMSUNG ELECTRONICS CO., LTD., Suwon-si (KR)

(72) Inventors: Junyeob Kim, Suwon-si (KR); Jiyun Jung, Suwon-si (KR); Jisun Kim, Suwon-si (KR)

(73) Assignees: SAMSUNG ELECTRONICS CO., LTD., Suwon-si (KR); Auros Technology, Inc., Hwaseong-si (KR)

( * ) Notice: Subject to any disclaimer, the term of this patent is extended or adjusted under 35 U.S.C. 154(b) by 276 days.

(21) Appl. No.: 18/435,692

(22) Filed: Feb. 7, 2024

(65) Prior Publication Data

US 2025/0045909 A1 Feb. 6, 2025

(30) Foreign Application Priority Data

Aug. 4, 2023 (KR) ........................ 10-2023-0102285

(51) Int. Cl.
*G06T 7/00* (2017.01)
*G03F 7/00* (2006.01)
*G06T 7/70* (2017.01)
*G06V 10/74* (2022.01)
(Continued)

(52) U.S. Cl.
CPC .......... *G06T 7/001* (2013.01); *G03F 7/70633* (2013.01); *G06T 7/70* (2017.01);
(Continued)

(58) Field of Classification Search
CPC ......... G06T 7/001; G06T 7/0002–0008; G06T 7/50; G06T 2207/20076; G06T 5/40;
(Continued)

(56) References Cited

U.S. PATENT DOCUMENTS 7,375,810 B2 5/2008 Nikoonahad et al.
7,626,691 B2 * 12/2009 Do ...................... G03F 7/70633 356/394

(Continued)

FOREIGN PATENT DOCUMENTS

KR 10-2012-0068128 A 6/2012
KR 10-2015-0082573 A 7/2015
WO 2011/068056 A1 6/2011

OTHER PUBLICATIONS

Tsai, D. M., & Lai, S. C. (2008). Defect detection in periodically patterned surfaces using independent component analysis. Pattern Recognition, 41(9), 2812-2832. (Year: 2008).*
Communication dated Sep. 28, 2026 issued by the Korean Intellectual Property Office in counterpart Korean Application No. 10-2023-0102285.

*Primary Examiner* — Andrew W Bee
*Assistant Examiner* — Emma E Dryden
(74) *Attorney, Agent, or Firm* — Sughrue Mion, PLLC

(57) ABSTRACT

An overlay measurement device includes a light source configured to direct an illumination to an overlay measurement target, a lens assembly configured to condense the illumination at a measurement position at any one point on the overlay measurement target, a detector configured to obtain a plurality of target overlay images through a beam reflected from the measurement position, a controller configured to determine at least one of a first similarity coefficient and a second similarity coefficient for each of the plurality of target overlay images and determine a defective overlay image from among the plurality of target overlay images based on at least one of the first similarity coefficient and the second similarity coefficient for each of the plurality of target overlay images, and a memory configured to store a normal overlay image and defect data corresponding to the defective overlay image.

19 Claims, 18 Drawing Sheets

(52) U.S. Cl.
CPC ...................... *G06V 10/761* (2022.01); *G06T 2207/20132* (2013.01); *G06T 2207/30148* (2013.01)

(58) Field of Classification Search
CPC ....................... G06T 7/11; G06T 2207/20224; G06T 5/50; G06T 2207/30148; G06V 10/761; G06V 2201/06; G06V 10/98; H01L 22/00–12; H01L 21/67242; H01L 22/24; H01L 22/30; H01L 22/20; H01L 21/67288; G03F 7/70616; G03F 7/70625; G03F 7/70633; G03F 7/70641; G03F 7/7065; G03F 7/706851; G03F 7/706843; G03F 7/706837; G03F 7/706835; G03F 7/70681; G03F 7/70653; G03F 7/70666; G03F 7/70683
See application file for complete search history.

(56) References Cited

U.S. PATENT DOCUMENTS

| | | | | |
|---|---|---|---|---|
| 9,702,693 | B2 | 7/2017 | Ghinovker et al. | |
| 10,242,290 | B2 | 3/2019 | Tarshish-Shapir et al. | |
| 10,527,952 | B2 | 1/2020 | Grunzweig et al. | |
| 11,354,798 | B2 | 6/2022 | Lee et al. | |
| 11,557,034 | B2 | 1/2023 | Singer et al. | |
| 2012/0257041 | A1* | 10/2012 | Nakagaki | H01J 37/28<br>348/80 |
| 2013/0259358 | A1* | 10/2013 | Chen | G06T 7/68<br>382/149 |
| 2014/0136137 | A1 | 5/2014 | Tarshish-Shapir et al. | |
| 2014/0169657 | A1* | 6/2014 | Harada | H01L 22/20<br>382/145 |
| 2023/0075297 | A1 | 3/2023 | Brauer | |

* cited by examiner

OVERLAY MEASUREMENT DEVICE AND OVERLAY MEASUREMENT METHOD

CROSS-REFERENCE TO RELATED APPLICATIONS

This application is based on and claims priority under 35 U.S.C. § 119 to Korean Patent Application No. 10-2023-0102285, filed on Aug. 4, 2023, in the Korean Intellectual Property Office, the disclosure of which is incorporated by reference herein in its entirety.

BACKGROUND

Example embodiments of the disclosure relate to an overlay measurement device and an overlay measurement method.

In general, the size of semiconductor devices for measuring wafer characteristics is decreasing and the density of integrated circuits in measurement devices is increasing. In order to form an integrated circuit on a wafer, numerous manufacturing processes may be performed to sequentially form a desired circuit structure and elements at determined locations. These manufacturing processes allow for the sequential formation of patterned layers on a wafer.

Through these repeated stacking processes, electrically active patterns are formed within an integrated circuit. If each structure is not aligned within the tolerance range allowed in the production process, interference may occur between electrically activated patterns, which may cause problems with the performance and reliability of the manufactured circuit.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide an overlay measurement device and an overlay measurement method having improved reliability and accuracy.

Additional aspects will be set forth in part in the description which follows and, in part, will be apparent from the description, or may be learned by practice of the presented embodiments.

According to an aspect of an example embodiment, an overlay measurement device may include a light source configured to direct an illumination to an overlay measurement target, a lens assembly configured to condense the illumination at a measurement position at any one point on the overlay measurement target, a detector configured to obtain a plurality of target overlay images through a beam reflected from the measurement position, a controller configured to determine at least one of a first similarity coefficient and a second similarity coefficient for each of the plurality of target overlay images and determine a defective overlay image from among the plurality of target overlay images based on at least one of the first similarity coefficient and the second similarity coefficient for each of the plurality of target overlay images, and a memory configured to store a normal overlay image and defect data corresponding to the defective overlay image, where the first similarity coefficient corresponds a similarity between the normal overlay image and one of the plurality of target overlay images and the second similarity coefficient corresponds to a similarity between a plurality of overlay keys of each of the plurality of target overlay images.

According to an aspect of an example embodiment, an overlay measurement device may include a light source configured to direct an illumination to an overlay measurement target, a lens assembly configured to condense the illumination at a measurement position at any one point on the overlay measurement target, a detector configured to obtain a plurality of target overlay images based on a beam reflected from the measurement position, a controller configured to perform preprocessing on each of the plurality of target overlay images and a normal overlay image, determine at least one of a first similarity coefficient and a second similarity coefficient for each of the plurality of preprocessed target overlay images, and determine a defective overlay image from among the plurality of preprocessed target overlay images based on at least one of the first similarity coefficient and the second similarity coefficient for each of the plurality of preprocessed target overlay images, and a memory configured to store defect data corresponding to the defective overlay image, where the first similarity coefficient corresponds to a similarity between the preprocessed normal overlay image and one of the plurality of preprocessed target overlay images, the second similarity coefficient represents a similarity between a plurality of overlay keys of each of the plurality of target overlay images, and the controller is configured to perform preprocessing by cropping a dummy area in each of the plurality of target overlay images and the preprocessed normal overlay image, the dummy area being an area other than a region of interest in each of the plurality of target overlay images and the normal overlay image, masking a second overlay key among a first overlay key and the second overlay key of the region of interest and storing each of the plurality of preprocessed target overlay images and the preprocessed normal overlay image in the memory.

According to an aspect of an example embodiment, an overlay measurement method may include obtaining a plurality of target overlay images by repeating measurement of an overlay measurement target where a first overlay key on a first layer and a second overlay key on a second layer that is on the first layer are located, determining at least one of a first similarity coefficient and a second similarity coefficient for each of the plurality of target overlay images, determining a defective overlay image from among the plurality of target overlay images based on at least one of the first similarity coefficient and the second similarity coefficient for each of the plurality of target overlay images, and storing a normal overlay image and defect data corresponding to the defective overlay image, where the first similarity coefficient corresponds to a similarity between the normal overlay image and one of the plurality of target overlay images, and the second similarity coefficient corresponds to a similarity between a plurality of overlay keys of each of the plurality of target overlay images.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
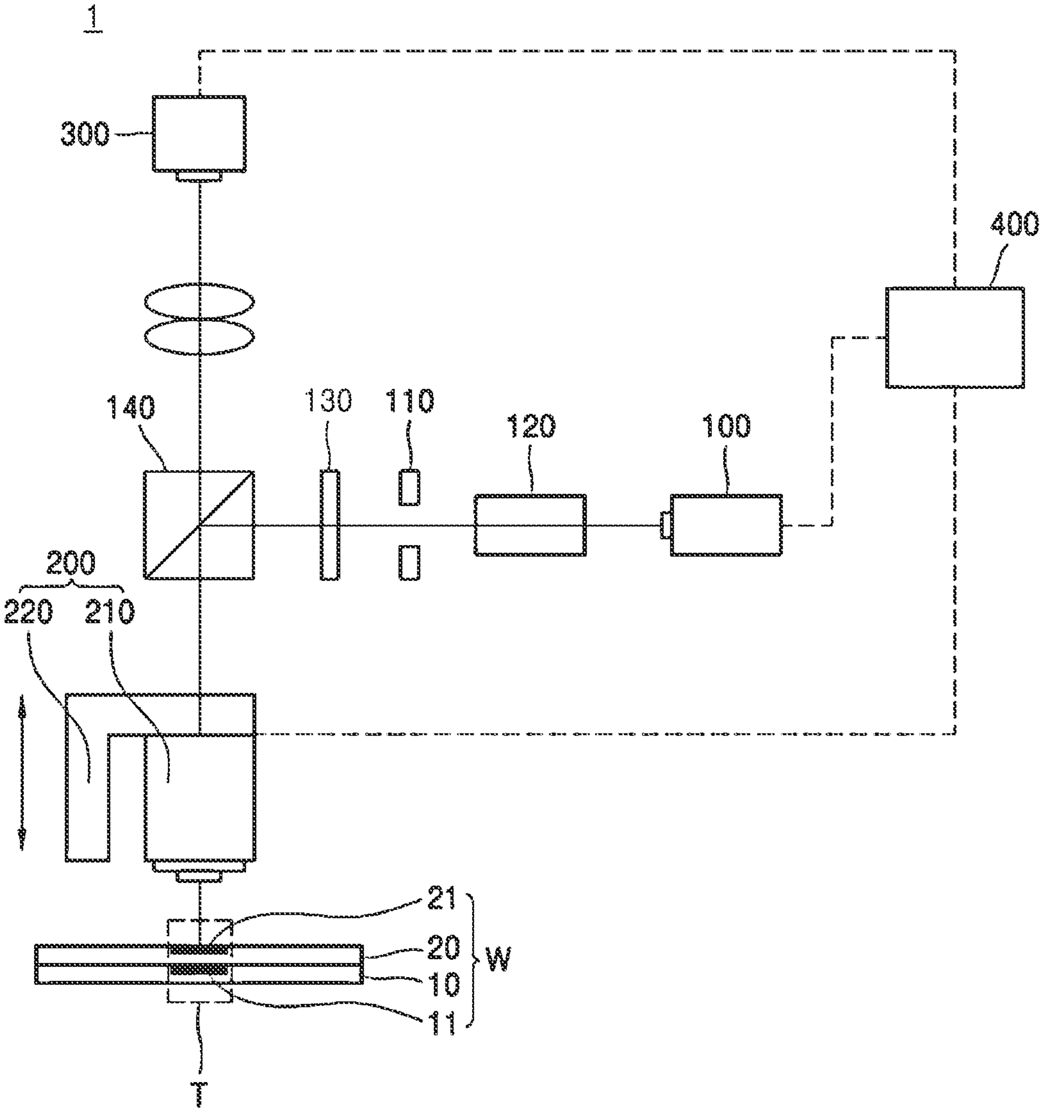
FIG. 1 is a diagram illustrating an overlay measurement device according to one or more example embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

FIG. 1 is a diagram illustrating an overlay measurement device according to one or more example embodiments.

Referring to FIG. 1, an overlay measurement device 1 according to some embodiments may be a device for measuring an error between a first overlay key 11 and a second overlay key 21 formed on different layers of a wafer W.

In some embodiments, the first overlay key 11 may be an overlay mark formed on a previous layer and the second overlay key 21 may be an overlay mark formed on a current layer. Overlay marks may be arranged on scribe lines while simultaneously forming a layer for forming a semiconductor device, in a die area.

In some embodiments, the first overlay key 11 may be formed together with an insulating film pattern. Also, the second overlay key 21 may be formed together with a photoresist pattern formed on the insulating film pattern. The second overlay key 21 may be exposed to the outside, and the first overlay key 11 may be covered by a photoresist layer. Additionally, the first overlay key 11 may include an oxide having different optical properties from the second overlay key 21 including the photoresist layer. The physical positions of the first overlay key 11 and the second overlay key 21 may be different from each other, but focal planes thereof may be the same or different.

The overlay measurement device 1 according to some embodiments may include a light source 100, a lens assembly 200, a detector 300, and a controller 400. The overlay measurement device 1 may be capable of directing illumination from at least one illumination source to an overlay measurement target T. The light source 100 may be configured to direct illumination to the overlay measurement target T on which the first overlay key 11 formed in a first layer 10 and the second overlay key 21 formed in a second layer 20 stacked on the first layer 10 are located.

In some embodiments, the light source 100 may include a halogen lamp, a xenon lamp, a supercontinuum laser light-emitting diode, a laser induced lamp, etc., and may include various wavelengths such as ultraviolet (UV) rays, visible light or infrared (IR) rays but is not limited thereto.

The overlay measurement device 1 according to an embodiment may include an aperture 110, a spectrum filter 120, a polarization filter 130, and a beam splitter 140.

The aperture 110 may include an opaque plate with an opening through which light passes, and a beam emitted from the light source 100 may be converted into a form suitable for capturing images of the first overlay key 11 and the second overlay key 21. The aperture 110 may include one or more of an aperture stop that controls the amount of light and a field stop that controls the range in which an image is formed, and may be formed between the light source 100 and the beam splitter 140, as illustrated in FIG. 1. Additionally, in some embodiments, the aperture 110 may be formed between the beam splitter 140 and the lens assembly 200.

The spectrum filter 120 may adjust the central wavelength and bandwidth of a beam emitted from the light source 100 to be suitable for obtaining images of the first overlay key 11 and the second overlay key 21 formed on the overlay measurement target T. In some embodiments, the spectrum filter 120 may include at least one of a filter wheel, a linear translation device, a flipper device, and a combination thereof.

The beam splitter 140 may pass a portion of the beam that has passed through the aperture 110 after being emitted from the light source 100. Additionally, the beam splitter 140 may reflect a portion of the beam and separate the beam emitted from the light source 100 into two beams.

In an embodiment, the lens assembly 200 may include an objective lens 210 that condenses the illumination at a measurement position at any one point on the overlay measurement targets T, and a lens focus actuator 220 that adjusts a distance between the objective lens 210 and the overlay measurement target T.

The objective lens 210 may condense the beam reflected from the beam splitter 140 at a measurement position where the first overlay key 11 and the second overlay key 21 of the wafer W are formed and collect the reflected beam. The objective lens 210 may be arranged on the lens focus actuator 220. The lens focus actuator 220 may adjust a distance between the objective lens 210 and the wafer W. The measurement position may be at least any one point of the overlay measurement target T, and may be located on the first layer 10 or the second layer 20. In some embodiments, the measurement position may be formed between the first overlay key 11 and the second overlay key 21. In addition, the measurement position may include depth of field at each stage according to driving of the lens focus actuator 220.

The detector 300 may obtain a plurality of target overlay images at the measurement position through the beam reflected from the measurement position. The detector 300 may capture the beam reflected at the measurement position and passed through the beam splitter 140. In addition, the detector 300 may obtain a plurality of target overlay images of the first overlay key 11 and the second overlay key 21 from the beam.

The detector 300 may include an optical detector capable of measuring a beam reflected from the overlay measurement target T. For example, the optical detector may include a charge-coupled device (CCD) that converts light into charges to extract an image, a complementary metal-oxide-semiconductor (CMOS) sensor (which is an integrated circuit), a photomultiplier tube (PMT) that measures light, an avalanche photodiode (APD) array as a photodetector, or various sensors that generate or capture images.

The detector 300 may include a filter, a polarizing plate, and a beam block and may further include any collection optical component for collecting illumination collected by the objective lens 210.

The controller 400 is described in detail with reference to FIG. 2.

Figure 2:
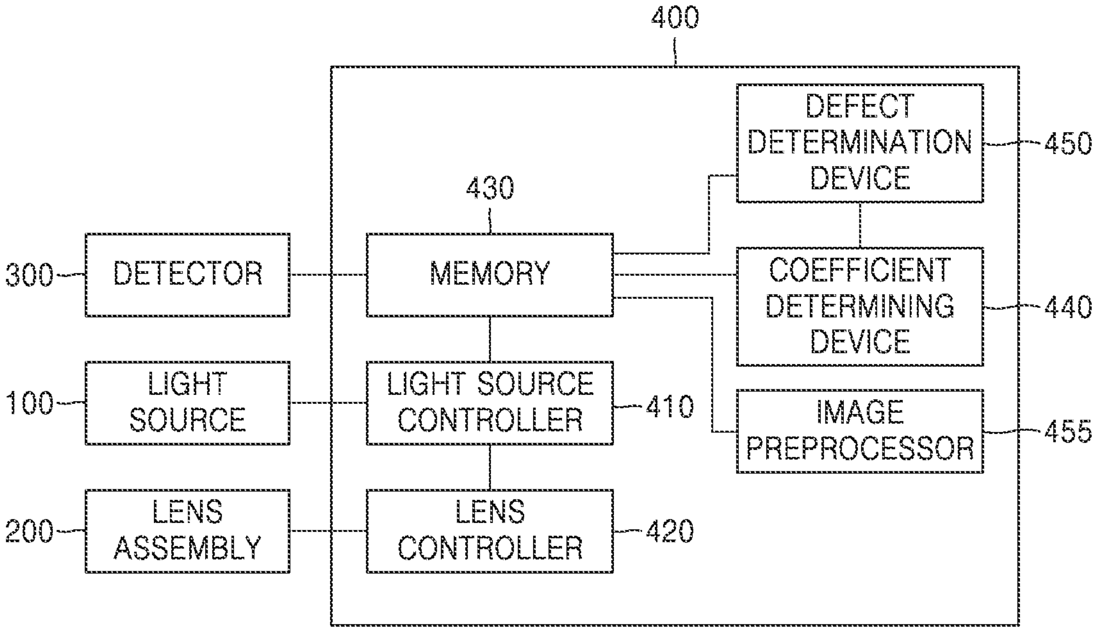
FIG. 2 is a diagram illustrating a controller of an overlay measurement device according to one or more example embodiments.

FIG. 2 is a diagram illustrating a controller of an overlay measurement device according to one or more example embodiments.

Referring to FIG. 2, the controller 400 of the overlay measurement device 1 according to some embodiments may include a light source controller 410, a lens controller 420, a memory 430, a coefficient determining device 440, a defect determination device 450, and an image preprocessor 455.

In some embodiments, the controller 400 may control a direction of illumination emitted from the light source 100 and control the lens assembly 200 to condense the illumination on the overlay measurement target T and collect a reflected beam. Additionally, the controller 400 may control the detector 300 to obtain a plurality of target overlay images measured through the reflected beam collected by the lens assembly 200. In addition, in some embodiments, the controller 400 may control the lens assembly 200 to change a depth of the overlay measurement target T according to a preset setting value and obtain a focus image for each depth of the overlay measurement target T.

The light source controller 410 may control directivity of illumination emitted from the light source 100. The lens controller 420 may control operation of the lens focus actuator 220 such that the illumination is condensed on the overlay measurement target T, and a plurality of target overlay images of the first layer 10 and the second layer 20 may be obtained based on to depth according to the setting value. The setting value may be a depth-specific movement value for the lens assembly 200 to move so as to measure an image of the overlay measurement target T at various depths. That is, the lens assembly 200 may move according to the setting value, and the focus on the overlay measurement target T may be changed according to depth.

The memory 430 may store the plurality of target overlay images of the first overlay key 11 and the second overlay key 21 obtained by the detector 300 according to the setting value. In some embodiments, the memory 430 may store a previously obtained normal overlay image. Additionally, the memory 430 may store defect data corresponding to a defective overlay image. The defect data may include the type, name, coordinate values, etc., of defects in the defective overlay image. In some embodiments, the lens controller 420 may control the lens focus actuator 220 such that a distance between the objective lens 210 and the overlay measurement target T is repeatedly moved by the setting value. The memory 430 may obtain and store a plurality of target overlay images of the first overlay key 11 and the second overlay key 21 according to a depth having a certain difference (that is, a depth difference equal to the setting value).

The coefficient determining device 440 may determine at least one of a first similarity coefficient and a second similarity coefficient of each of the plurality of target overlay images stored in the memory 430. In some embodiments, the coefficient determining device 440 may determine a first similarity coefficient and a second similarity coefficient of each of the plurality of target overlay images. The first similarity coefficient may indicate a degree of similarity between the normal overlay image and one target overlay image among the plurality of target overlay images. That is, the first similarity coefficient may indicate a degree of similarity between the normal overlay image and the target overlay image. The second similarity coefficient may indicate a degree of similarity between a plurality of overlay keys of each of the plurality of target overlay images. That is, the second similarity coefficient may indicate a degree of similarity between a plurality of overlay keys existing within one target overlay image.

The defect determination device 450 may determine a defective overlay image from among the plurality of target overlay images based on at least one of a first similarity coefficient and a second similarity coefficient of each of the plurality of target overlay images. In some embodiments, the defect determination device 450 may determine a defective overlay image based on a plurality of preprocessed target overlay images and a normal overlay image. The overlay measurement target T may be deformed and/or damaged while undergoing through various semiconductor processing conditions. The defective overlay image may represent an overlay image for a deformed and/or damaged overlay measurement target T. The defect determination device 450 may improve the measurement accuracy and reliability of the overlay measurement device 1 by determining images of deformed or damaged overlay targets as a defective overlay image.

The image preprocessor 455 may perform preprocessing on each of the plurality of target overlay images and the normal overlay image. Image preprocessing may include cropping, masking, and saving. A dummy area other than a region of interest may be cropped from each of the plurality of target overlay images and the normal overlay image. The image preprocessing may be performed by masking the second overlay key 21, among the first overlay key 11 and the second overlay key 21, of the region of interest. After performing the masking operation, the image preprocessor 455 may store each of the plurality of preprocessed target overlay images and the preprocessed normal overlay image in the memory 430.

In addition, in some embodiments, the overlay measurement device 1 may further include a map generator. The map generator may generate a defect map by displaying the coordinates and defect type of the defective overlay image within a wafer.

Figure 3:
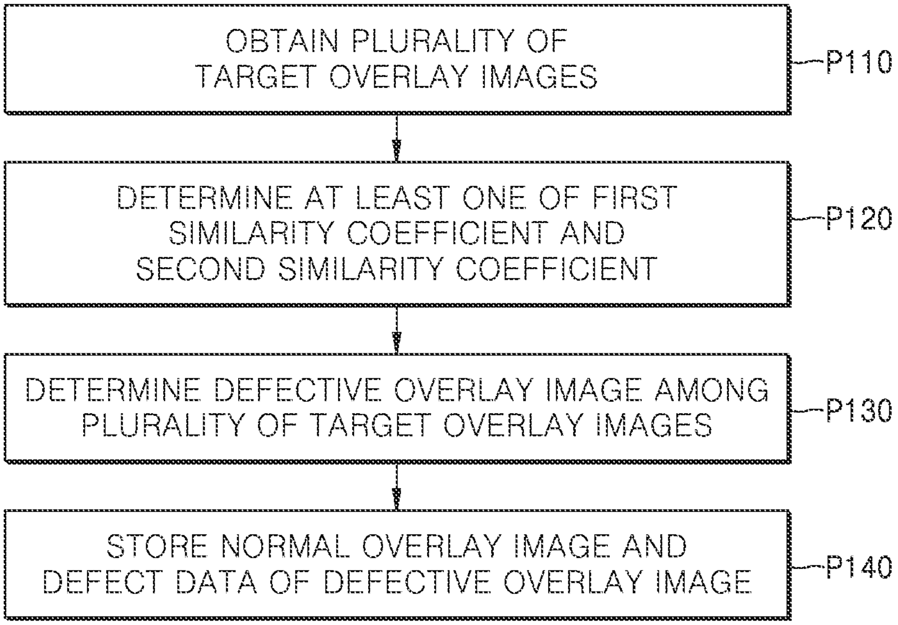
FIG. 3 is a flowchart of an overlay measurement method according to one or more example embodiments.

FIG. 3 is a flowchart of an overlay measurement method according to one or more example embodiments. Description of aspects similar to those described above may be omitted.

Referring to FIG. 3, in the overlay measurement method according to some embodiments, a plurality of target overlay images may be obtained in operation P110. The plurality of target overlay images may correspond to overlay images for a plurality of overlay targets. The plurality of target overlay images may be obtained through the detector 300 of the overlay measurement device 1 described above.

After obtaining a plurality of target overlay images, at least one of a first similarity coefficient and a second similarity coefficient of the plurality of target overlay images may be determined in operation P120. After determining at least one of the first similarity coefficient and the second similarity coefficient, a defective overlay image may be determined from among the plurality of target overlay images in operation P130.

The first similarity coefficient and/or the second similarity coefficient may be determined by the coefficient determining device 440 of the overlay measurement device 1 described above. One of the first similarity coefficient and the second similarity coefficient may be determined, and the defect determination device 450 may determine whether a target overlay image is a defective overlay image based on the determined similarity coefficient.

In some embodiments, the coefficient determining device 440 may determine the first similarity coefficient and the second similarity coefficient, and the defect determination device 450 may determine whether the target overlay image corresponds to a defective overlay image, based on a similarity coefficient obtained by combining the first similarity coefficient with the second similarity coefficient. Additionally, the coefficient determining device 440 may determine only one of the first similarity coefficient and the second similarity coefficient, and the defect determination device 450 may determine the target overlay image based on the similarity coefficient determined by the coefficient determining device 440.

The normal overlay image and defect data of the defective overlay image may be stored in operation P140.

Figure 4:
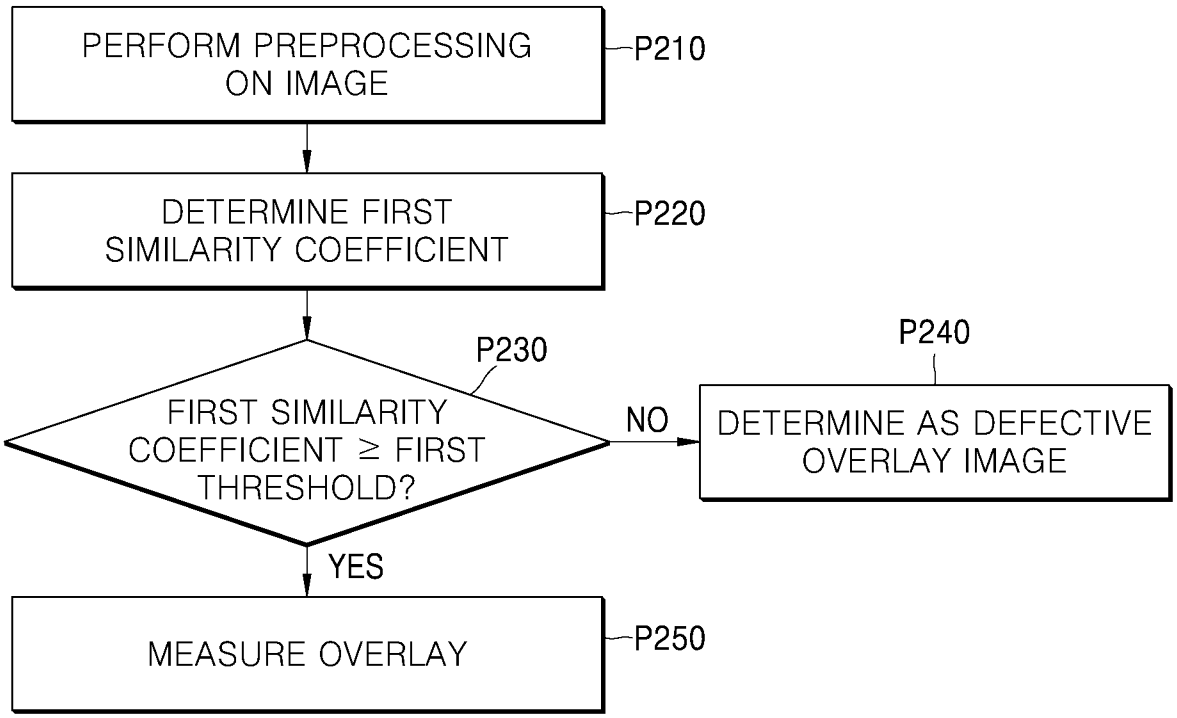
FIG. 4 is a flowchart of an overlay measurement method for determining a first similarity coefficient, according to one or more example embodiments.

FIG. 4 is a flowchart of an overlay measurement method for determining a first similarity coefficient, according to one or more example embodiments. FIGS. 5A to 5D are diagrams illustrating an image preprocessing method for a normal overlay image, according to one or more example embodiments. FIGS. 6A to 6D are diagrams illustrating an image preprocessing method for a target overlay image, according to one or more example embodiments. Description of aspects similar to those described above may be omitted.

Figure 5A:
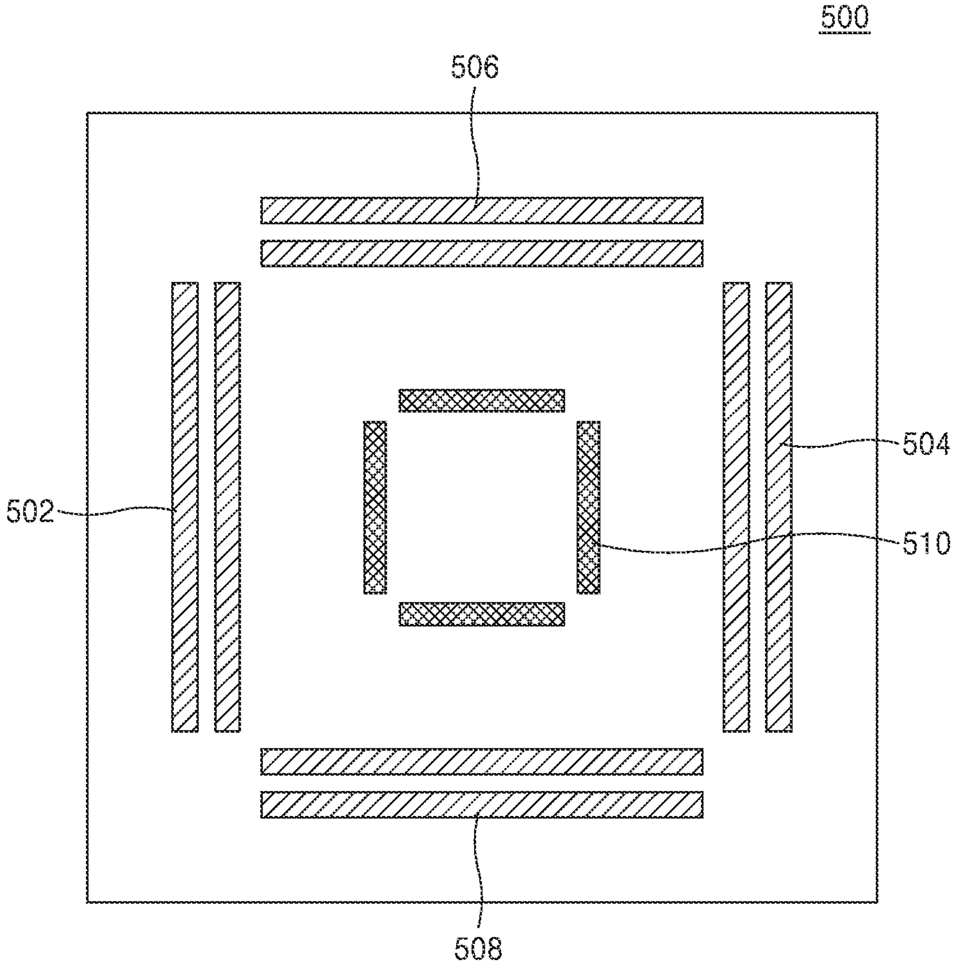
FIGS. 5A to 5D are diagrams illustrating an image preprocessing method for a normal overlay image, according to one or more example embodiments.

Referring to FIGS. 2, 4, and 5A, in the overlay measurement method for determining the first similarity coefficient, according to some embodiments, preprocessing on an image may be performed in operation P210. Preprocessing of the image may be performed by the image preprocessor 455 described above. The image preprocessor 455 may first perform preprocessing on a normal overlay image 500 stored in the memory 430. The normal overlay image 500 may include a first overlay key of a first layer and a second overlay key 510 of a second layer. The first overlay key may include a plurality of keys, each having a rectangular shape.

In some embodiments, the first overlay key may include a first vertical key 502, a second vertical key 504, a first horizontal key 506, and a second horizontal key 508. The first overlay key may be arranged to surround the second overlay key 510. The second overlay key 510 may be arranged in a center of the normal overlay image 500. Additionally, the second overlay key 510 may include a plurality of keys each having a rectangular shape, similar to the first overlay key.

Figure 5B:
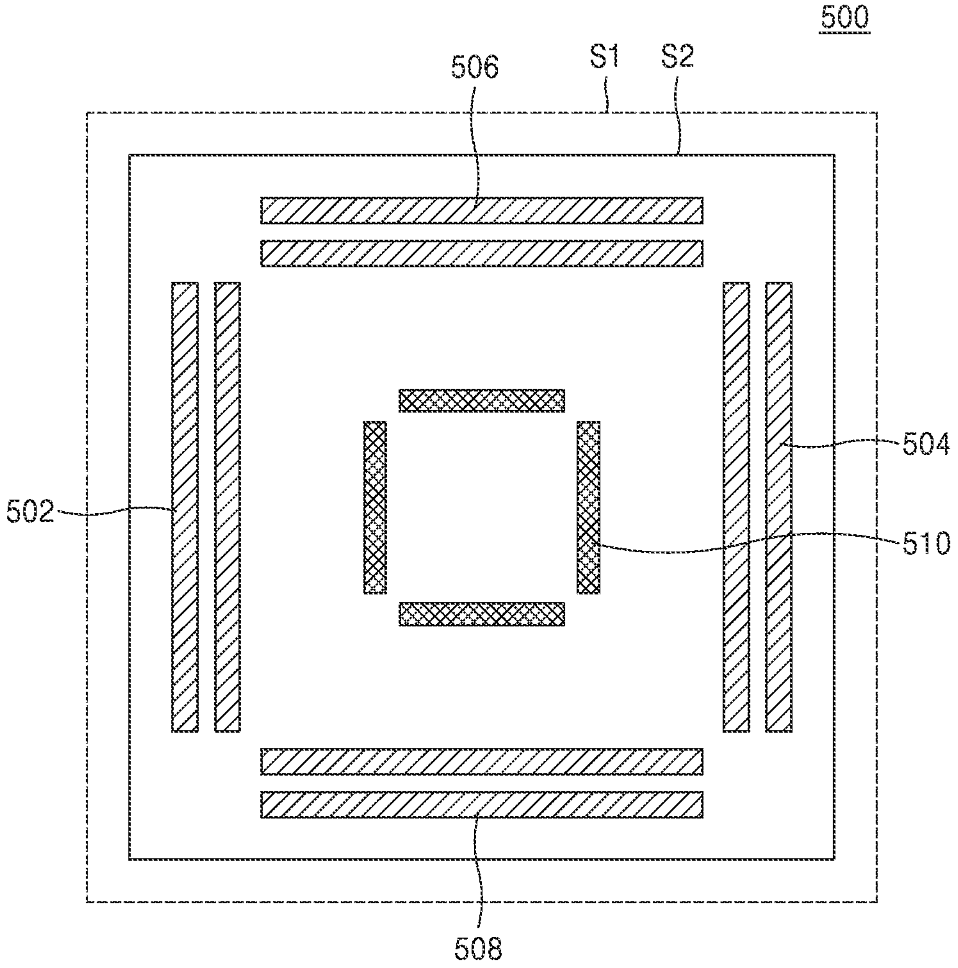

Referring to FIGS. 2, 4, and 5B, the image preprocessor 455 may crop a dummy area other than a region of interest with respect to the normal overlay image 500. The region of interest may correspond to a second region S2, and the dummy area may be a region of the first region S1 excluding the second region S2. Through this, when determining a first similarity coefficient of an overlay image, the accuracy of the first similarity coefficient may be improved by removing unnecessary areas.

Figure 5C:
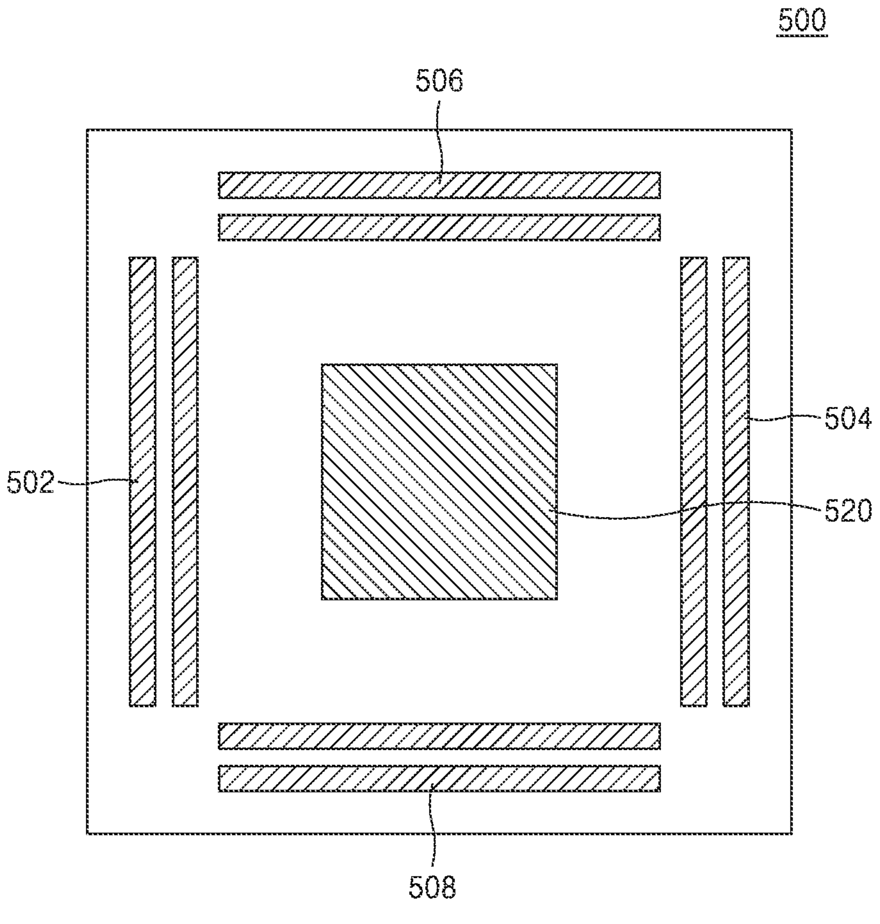

Referring to FIGS. 2, 4, and 5C, the image preprocessor 455 may mask the second overlay key from among the first overlay key and the second overlay key 510 of the region of interest S2 of the normal overlay image 500. Masking may refer to covering some areas of the normal overlay image 500 with a dummy pattern 520. By masking the second overlay key 510, measurement accuracy of the first similarity coefficient for the first overlay key may be improved. Additionally, the disclosure is not limited thereto, and in other embodiments, the first overlay key instead of the second overlay key may be masked, and a first similarity coefficient for the second overlay key may be determined. Additionally, the masked normal overlay image 500 may be stored in the memory 430.

Referring to FIGS. 2 and 6A to 6C, image preprocessing may be performed on any one target overlay image 600 among a plurality of target overlay images to be inspected. The target overlay image 600 may include a first overlay key and a second overlay key 610, similar to the normal overlay image 500. In some embodiments, the first overlay key of the target overlay image 600 may include a first vertical key 602, a second vertical key 604, a first horizontal key 606, and a second horizontal key 608. As an example, the first vertical key 602 and the second horizontal key 608 of the target overlay image 600 are shown as having defects. The target overlay image 600 may be cropped from the first region S1 to the second region S2 by the image preprocessor 455. The second region S2 may correspond to a region of interest excluding a dummy area. The second overlay key 510 may be masked with a dummy pattern 620. In this way, the target overlay image 600 on which the masking process has been completed may be stored in the memory 430.

Figure 5D:
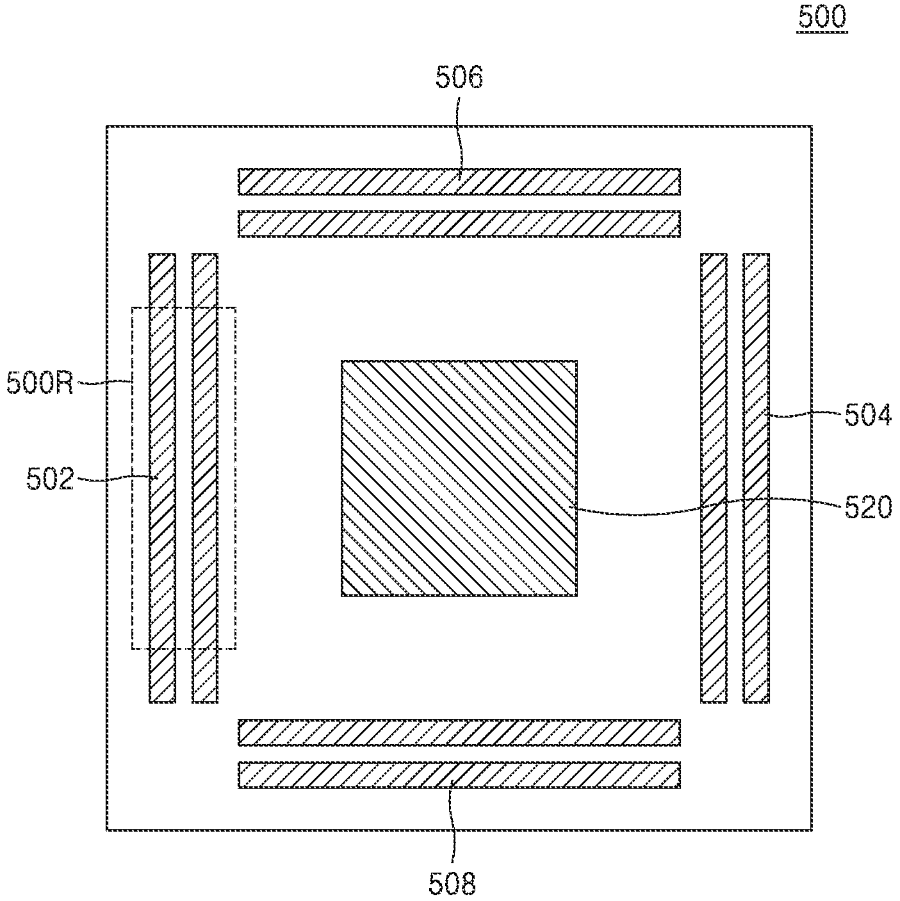
Figure 6A:
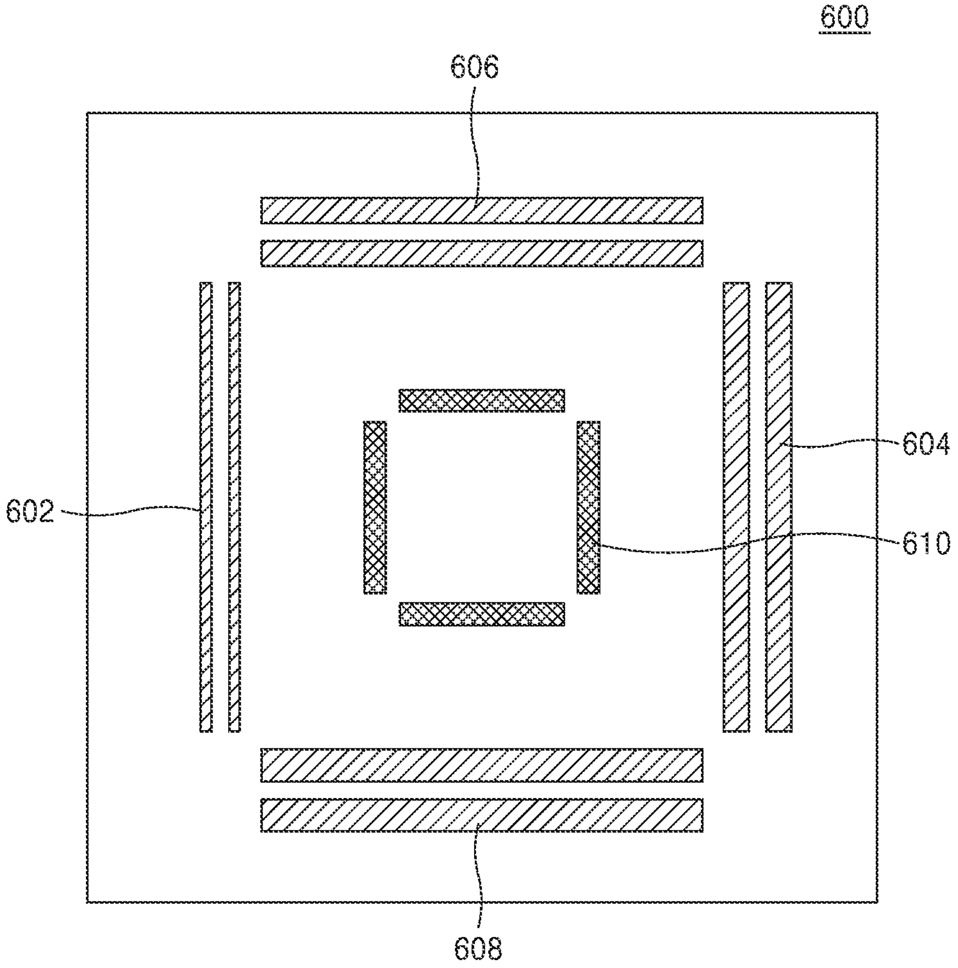
FIGS. 6A to 6D are diagrams illustrating an image preprocessing method for a target overlay image, according to one or more example embodiments.
Figure 6B:
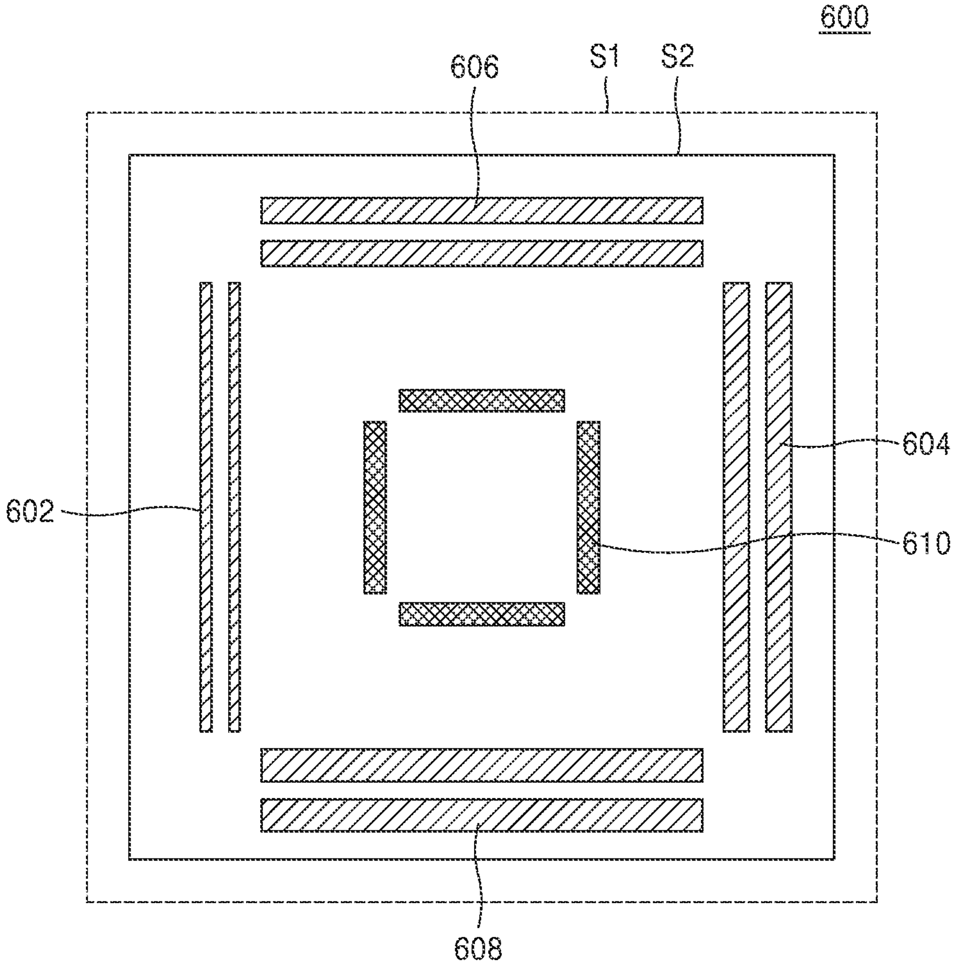
Figure 6C:
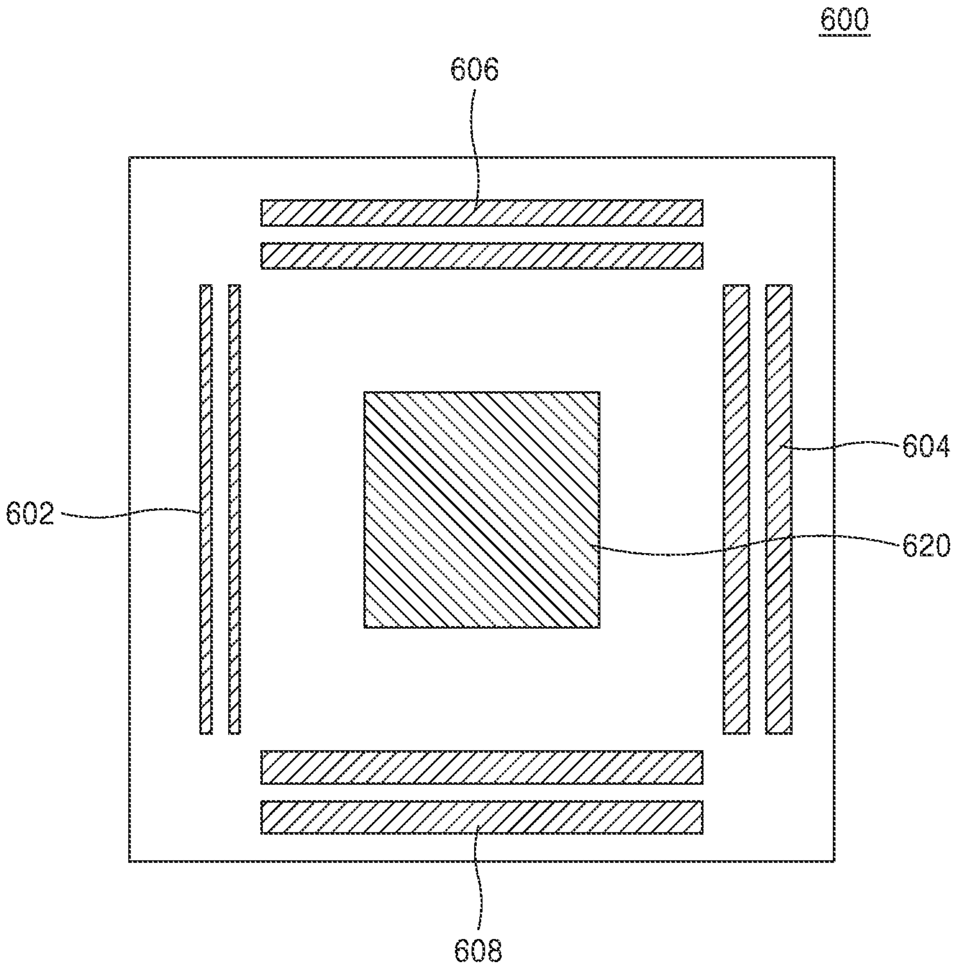
Figure 6D:
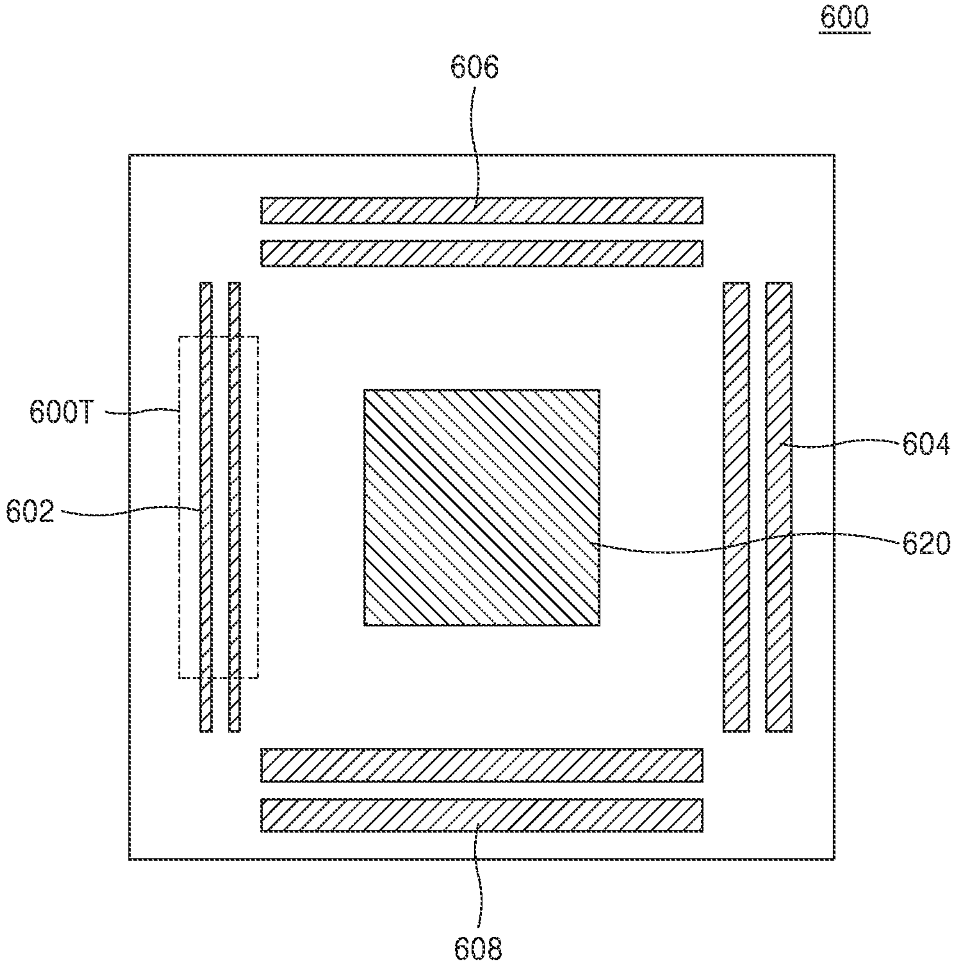

Referring to FIGS. 4, 5D, and 6D, after performing preprocessing on the image, a first similarity coefficient of any one target overlay image among the plurality of target overlay images may be determined in operation P220. To this end, a reference region 500R may be determined for the normal overlay image 500 and a comparison region 600T may be determined for the target overlay image 600. In some embodiments, the reference region 500R for the first vertical key 502 of the normal overlay image 500 may be determined. Similarly, a comparison region 600T for the first vertical key 602 of the target overlay image 600 may be determined. The first similarity coefficient may be determined based on a similarity between the reference region 500R of the normal overlay image 500 and the comparison region 600T of the target overlay image 600. The first similarity coefficient may be determined based on a cross-correlation algorithm. However, the algorithm used to determine the first similarity coefficient is not limited to the cross-correlation algorithm.

In some embodiments, the first vertical key 502 of the normal overlay image 500 and the first vertical key 602 of the target overlay image 600 are compared. In other embodiments, the second vertical key 504 of the normal overlay image 500 and the second vertical key 504 of the target overlay image 600 may be compared with each other to derive the first similarity coefficient. Additionally, the first similarity coefficient may be derived by comparing the first horizontal key 506 of the normal overlay image 500 with the first horizontal key 606 of the target overlay image 600. Additionally, the first similarity coefficient may be derived by comparing the second horizontal key 508 of the normal overlay image 500 with the second horizontal key 608 of the target overlay image 600. Additionally, in some embodiments, the first similarity coefficient may be derived by comparing at least two of the first vertical key 502, the second vertical key 504, the first horizontal key 506, and the second horizontal key 508 of the normal overlay image 500 with at least two corresponding keys of the target overlay image 600.

As illustrated in FIG. 6D, since the first vertical key 602 of the target overlay image 600 appears abnormally thin, the first similarity coefficient may be lower than a preset first threshold.

After determining the first similarity coefficient, the first similarity coefficient and the first threshold may be compared with each other in operation P230. In some embodiments, when the first similarity coefficient is smaller than (e.g., less than) the first threshold, a target overlay image having the first similarity coefficient may be determined as a defective overlay image in operation P240. Since the first vertical key 602 of the target overlay image 600 of FIG. 6D has an abnormal key shape compared to the first vertical key 502 of the normal overlay image 500, the first similarity coefficient having a relatively low value may be determined. Accordingly, the target overlay image 600 may be determined as a defective overlay image. Additionally, in some embodiments, when the first similarity coefficient is greater than or equal to the first threshold, a target overlay image having the first similarity coefficient may be determined as a normal overlay image, in operation P250.

Operations P210 to P230 for a plurality of target overlay images may be repeatedly performed to determine all target overlay images, and then an overlay may be measured for images determined as normal overlay images in operation P250. The remaining groups excluding target overlay images determined as defective overlay images among the plurality of target overlay images may be re-determined and/or generated as a final target overlay image. Through this, overlay measurement described later may be performed after excluding overlay images for defective targets.

Figure 7:
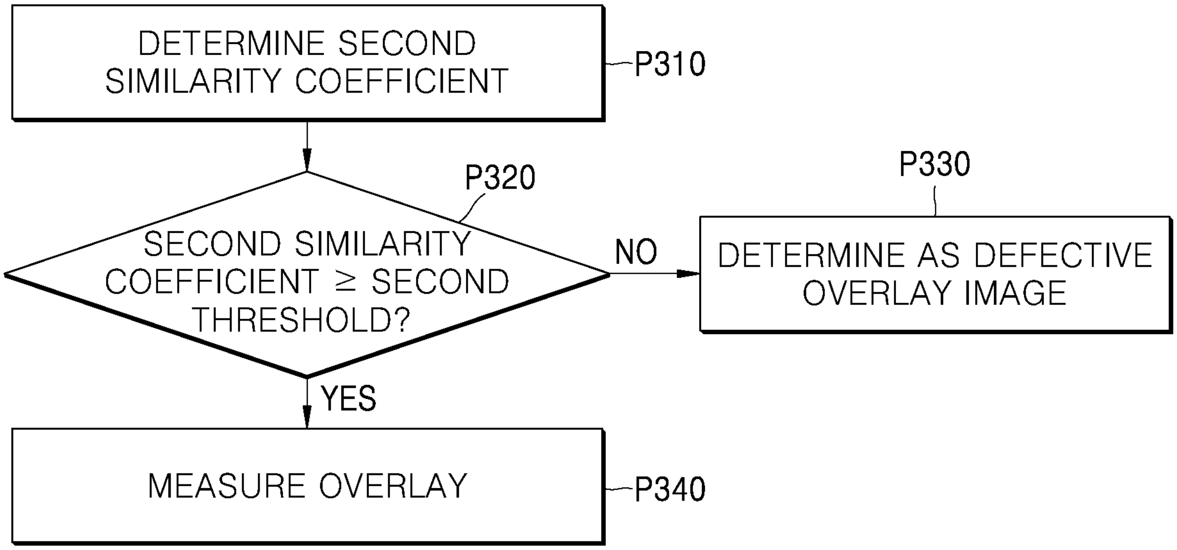
FIG. 7 is a flowchart of an overlay measurement method for determining a second similarity coefficient, according to one or more example embodiments.

FIG. 7 is a flowchart of an overlay measurement method for determining a second similarity coefficient, according to one or more example embodiments. FIGS. 8A to 8D are diagrams for describing an overlay measurement method for determining a second similarity coefficient, according to one or more example embodiments.

Figure 8A:
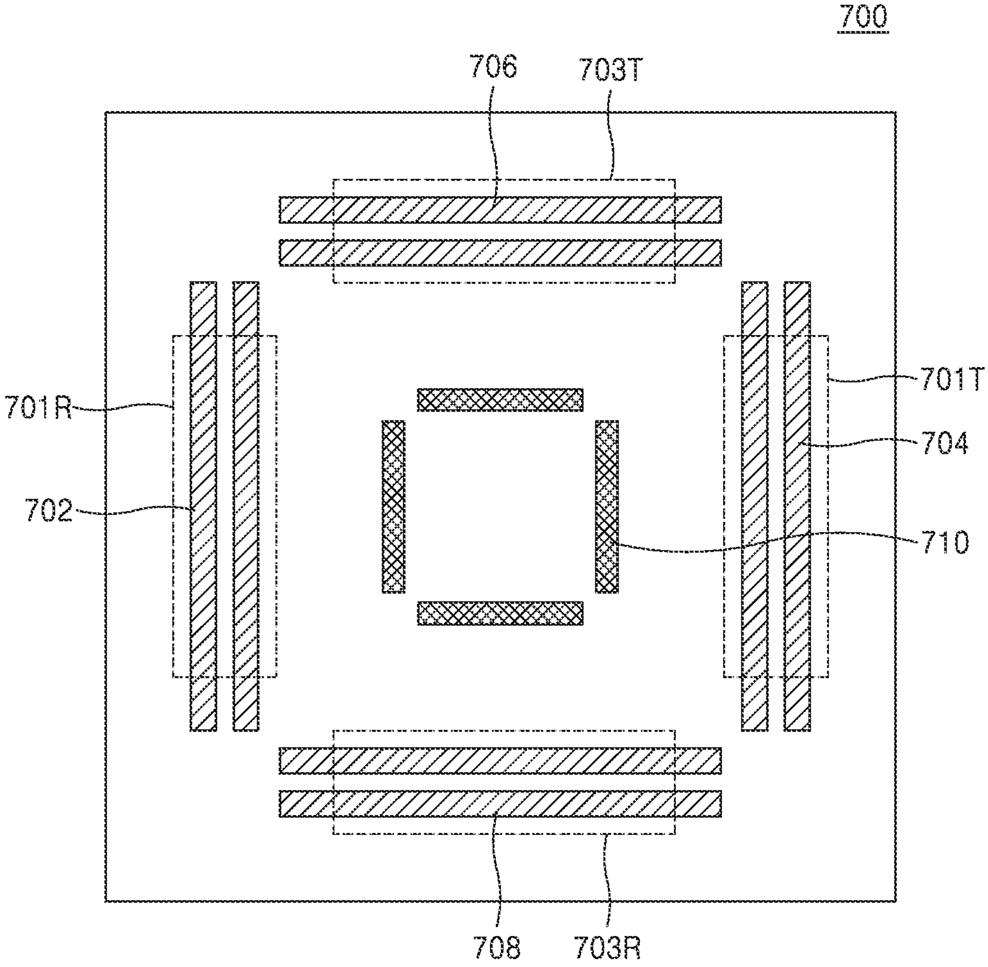
FIGS. 8A to 8D are diagrams for describing an overlay measurement method for determining a second similarity coefficient, according to one or more example embodiments.

Referring to FIGS. 7 and 8A, in the overlay measurement method for determining a second similarity coefficient, a second similarity coefficient for each of a plurality of target overlay images may be determined in operation P310. Unlike when determining the first similarity coefficient, in the method of determining the second similarity coefficient, comparison with a normal overlay image is not performed, but rather, a plurality of keys in any one target overlay image 700 among a plurality of target overlay images may be compared with each other to determine the second similarity coefficient. Additionally, when determining the second similarity coefficient, image preprocessing on the target overlay image 700 may be omitted.

In some embodiments, the second similarity coefficient may be determined by comparing a first vertical key 702 of the target overlay image 700 with a second vertical key 704 of the target overlay image 700 and comparing a first horizontal key 706 of the target overlay image 700 with a second horizontal key 708 of the target overlay image 700. The first vertical key 702 of the target overlay image 700 may be determined as a first reference region 701R, and the second vertical key 704 may be determined as a first comparison region 701T. Additionally, the second horizontal key 708 of the target overlay image 700 may be determined as a second reference region 703R, and the first horizontal key 706 may be determined as a second comparison region 703T. The second similarity coefficient may be determined by deriving a comprehensive similarity by comparing the first reference region 701R with the first comparison region 701T and comparing the second reference region 703R with the second comparison region 703T.

That is, a comprehensive similarity may be derived by comparing the first vertical key 702 of the target overlay image 700 with the second vertical key 704 of the target overlay image 700, and comparing the first horizontal key 706 of the target overlay image 700 with the second horizontal key 708 of the target overlay image 700. As with the first similarity coefficient, the second similarity coefficient may be determined based on a cross-correlation algorithm. However, the algorithm used to determine the second similarity coefficient is also not limited to the cross-correlation algorithm.

Figure 8B:
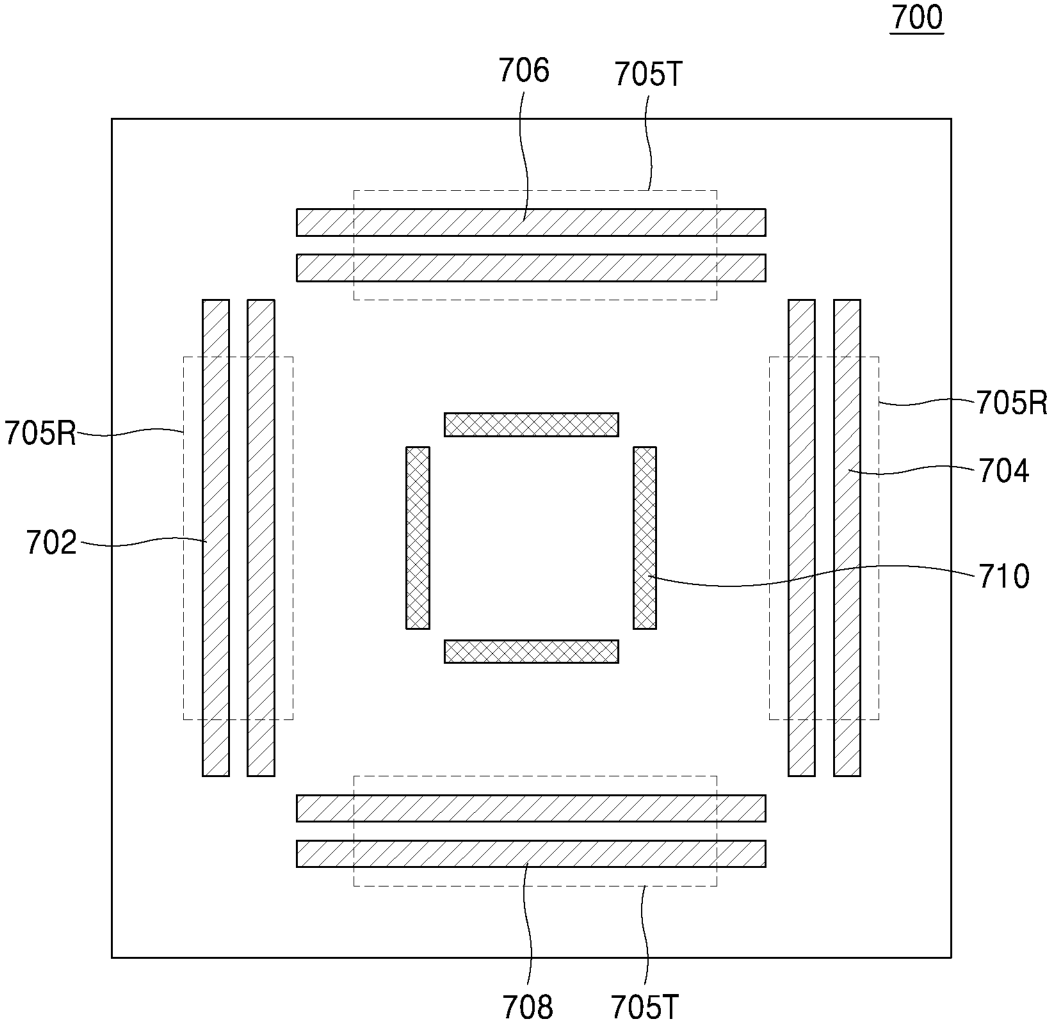

Referring to FIGS. 7 and 8B, in some embodiments, the first vertical key 702 and the second vertical key 704 of the target overlay image 700 may be determined as a reference region 705R. Additionally, the first horizontal key 706 and the second horizontal key 708 of the target overlay image 700 may be determined as the comparison region 705T. As described above, the second similarity coefficient may be derived by comparing the first vertical key 702 and the second vertical key 704 of the target overlay image 700 with the first horizontal key 706 and the second horizontal key 708 of the target overlay image 700. That is, the second similarity coefficient may be derived by comparing the reference region 705R with the comparison region 705T.

Figure 8C:
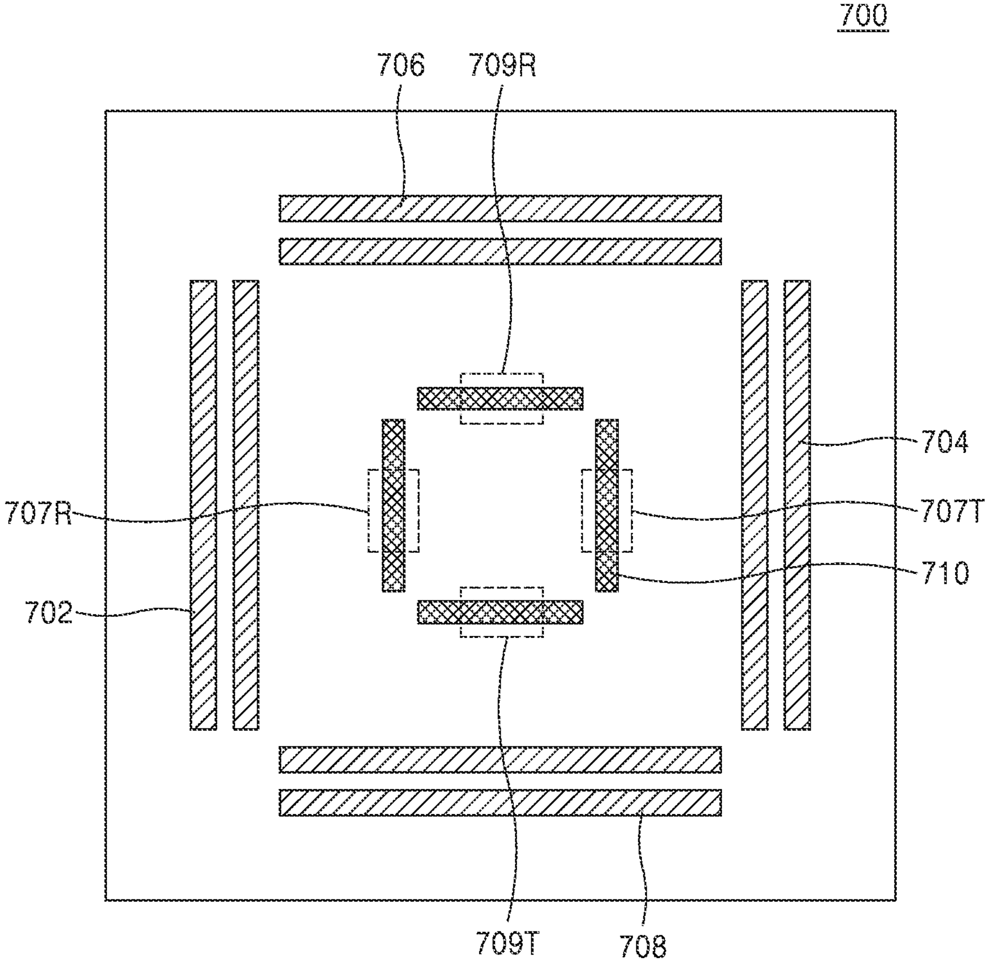

Referring to FIGS. 7 and 8C, in some embodiments, by determining a first reference region 707R, a first comparison region 707T, a second reference region 709R, and a second comparison region 709T in the second overlay key 710 of the target overlay image 700, the second similarity coefficient for the second overlay key 710 may be determined.

Figure 8D:
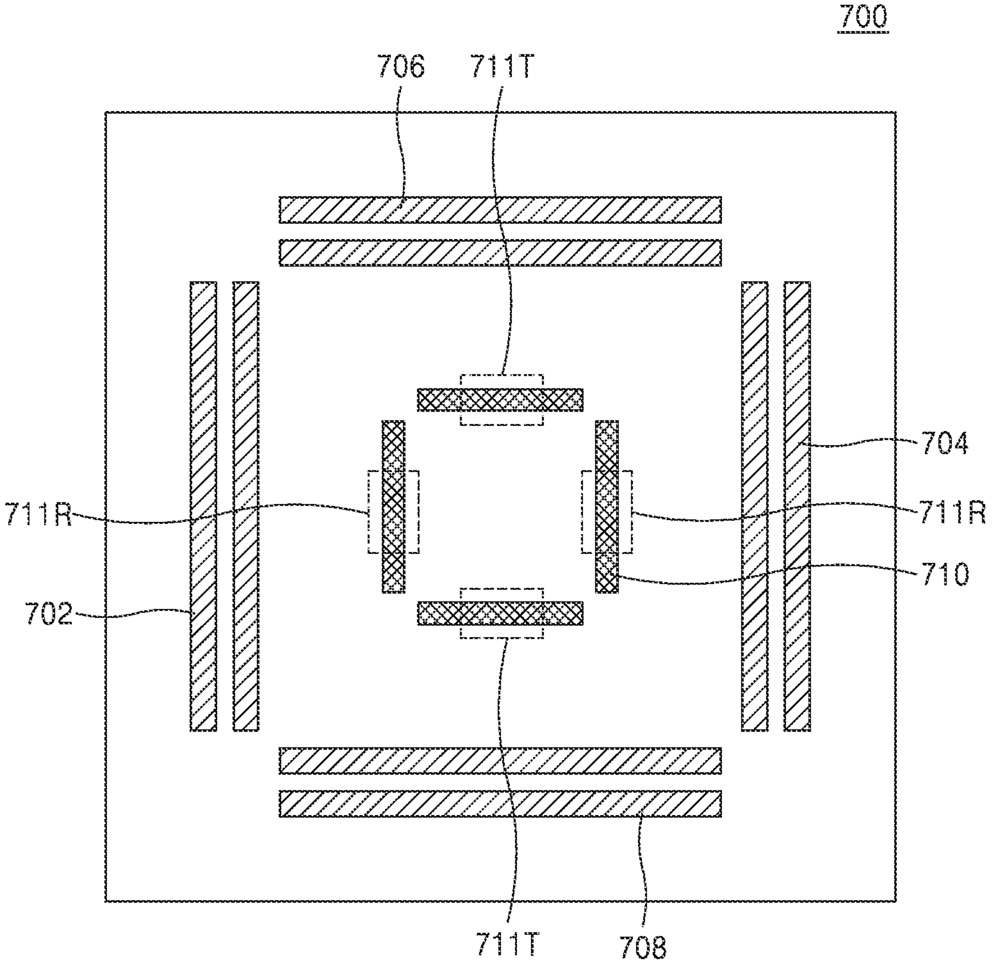

Referring to FIGS. 7 and 8D, in some embodiments, by determining a plurality of reference regions 711R for a plurality of vertical keys and a plurality of comparison regions 711T for a plurality of horizontal keys in the second overlay key 710 of the target overlay image 700, the second similarity coefficient for the second overlay key 710 may be determined.

After determining the second similarity coefficient, the second similarity coefficient and a preset second threshold may be compared with each other in operation P320. In some embodiments, when the second similarity coefficient is smaller than (e.g., less than) the second threshold, a target overlay image having the second similarity coefficient may be determined as a defective overlay image in operation P330. When the second similarity coefficient is greater than or equal to the second threshold, a target overlay image having the second similarity coefficient may be determined as a normal overlay image, in operation P340.

Figure 9:
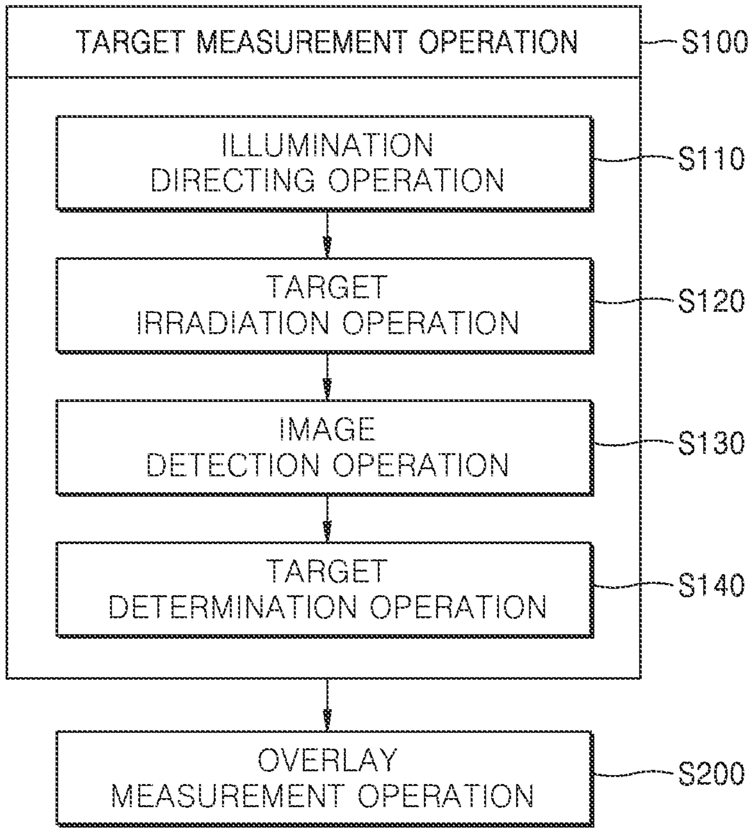
FIG. 9 is a flowchart of an overlay measurement method according to one or more example embodiments.

FIG. 9 is a flowchart of an overlay measurement method according to one or more example embodiments. Description of aspects similar to those described above may be omitted.

Referring to FIG. 9, a target measurement operation (S100) may include an illumination directing operation (S110), a target irradiation operation (S120), an image detection operation (S130), and a target determination operation (S140).

The illumination directing operation (S110) may be an operation in which illumination of the light source 100 is directed to the overlay measurement target T. In the illumination directing operation (S110), illumination may be directed from the light source 100 to the overlay measurement target T where the first overlay key 11 and the second overlay key 21 are located.

The target irradiation operation (S120) may be an operation in which the illumination passes through the lens assembly 200 and is condensed at a measurement position at any one point on the overlay measurement target T by controlling the lens focus actuator 220, which controls a distance between the objective lens 210 and the overlay measurement target T.

In the target irradiation operation (S120), according to the control of the controller 400, the lens focus actuator 220 may vertically move the objective lens 210 toward the wafer W to adjust a focal length, and the objective lens 210 may condense a beam reflected from the beam splitter 140, at a measurement position on the wafer W where the first overlay key 11 and the second overlay key 21 are formed.

For example, in the target irradiation operation (S120), the beam directed in the illumination directing operation (S110) may be condensed on the measurement position formed between the first overlay key 11 and the second overlay key 21, according to driving of the lens focus actuator 220.

The image detection operation (S130) may be an operation in which a plurality of target overlay images at the measurement position are obtained using the detector 300 through the beam reflected from the measurement position.

In the image detection operation (S130), the beam that has passed through the beam splitter 140 may be detected, and images of the first overlay key 11 and the second overlay key 21 may be obtained and stored in the memory 430.

The target determination operation (S140) may be an operation of excluding defective overlay images from among the plurality of target overlay images through the overlay measurement method described above.

As described above, after sorting a final target overlay image by excluding defective overlay images having defects among the plurality of target overlay images, an overlay may be measured with improved reliability and accuracy in the overlay measurement operation (S200).

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

At least one of the devices, units, components, modules, units, or the like (collectively "devices") represented by a block or an equivalent indication in the above embodiments including, but not limited to, the "controller 400" and its corresponding components in FIG. 2, may be physically implemented by analog and/or digital circuits including one or more of a logic gate, an integrated circuit, a microprocessor, a microcontroller such as a central processing unit (CPU), a memory circuit, a passive electronic component, an active electronic component, an optical component, and the like, and the functions or operations of the devices may be implemented by or driven by software and/or firmware executed by the devices.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. An overlay measurement device comprising:

a light source configured to direct an illumination to an overlay measurement target;

a lens assembly configured to condense the illumination at a measurement position at any one point on the overlay measurement target;

a detector configured to obtain a plurality of target overlay images through a beam reflected from the measurement position;

a controller configured to:

determine a first similarity coefficient for each of the plurality of target overlay images; and determine a defective overlay image from among the plurality of target overlay images based on the first similarity coefficient for each of the plurality of target overlay images; and a memory configured to store a normal overlay image and defect data corresponding to the defective overlay image, wherein the first similarity coefficient corresponds to a similarity between a plurality of overlay keys of each of the plurality of target overlay images, wherein a first target overlay image among the plurality of target overlay images comprises an overlay key comprising a first key and a second key, and wherein the controller is further configured to:

determine the first similarity coefficient based on a similarity between the first key and the second key; and determine the first target overlay image as the defective overlay image based on the first similarity coefficient being smaller than a preset first threshold.

2. The overlay measurement device of claim 1, wherein the controller is further configured to perform preprocessing on each of the plurality of target overlay images and the normal overlay image, and wherein the controller is configured to determine the defective overlay image based on the plurality of preprocessed target overlay images and the preprocessed normal overlay image.

3. The overlay measurement device of claim 2, wherein the controller is configured to perform the preprocessing by:

cropping a dummy area in each of the plurality of target overlay images and the normal overlay image, the dummy area being different from a region of interest; and masking a second overlay key among a first overlay key and the second overlay key of the region of interest, and wherein the controller is further configured to store each of the plurality of preprocessed target overlay images and the preprocessed normal overlay image in the memory.

4. The overlay measurement device of claim 1, wherein a second similarity coefficient corresponds to a similarity between the normal overlay image and one of the plurality of target overlay images, and wherein the controller is configured to determine the second similarity coefficient by comparing the normal overlay image with a second target overlay image among the plurality of target overlay images.

5. The overlay measurement device of claim 4, wherein the controller is configured to:

compare the second similarity coefficient with a preset second threshold; and determine the second target overlay image as the defective overlay image based on the second similarity coefficient being smaller than the preset second threshold.

6. The overlay measurement device of claim 4, wherein the controller is configured to determine the second similarity coefficient by:

comparing a first overlay key of the normal overlay image with a first overlay key of the second target overlay image; or comparing a second overlay key of the normal overlay image with a second overlay key of the second target overlay image.

7. The overlay measurement device of claim 4, wherein the first similarity coefficient is determined based on a first horizontal key, a second horizontal key, a first vertical key, and a second vertical key constituting a first overlay key in the first target overlay image.

8. The overlay measurement device of claim 7, wherein the first key is the first horizontal key and the second key is the second horizontal key, or the first key is the first vertical key and the second key is the second vertical key.

9. The overlay measurement device of claim 1, wherein the controller is further configured to:

generate a defect map based on the defect data stored in the memory; and display coordinates of the defective overlay image and a defect type within a wafer.

10. An overlay measurement device comprising:

a light source configured to direct an illumination to an overlay measurement target;

a lens assembly configured to condense the illumination at a measurement position at any one point on the overlay measurement target;

a detector configured to obtain a plurality of target overlay images based on a beam reflected from the measurement position;

a controller configured to:

perform preprocessing on each of the plurality of target overlay images and a normal overlay image;

determine a first similarity coefficient for each of the plurality of preprocessed target overlay images;

determine a defective overlay image from among the plurality of preprocessed target overlay images based on the first similarity coefficient for each of the plurality of preprocessed target overlay images; and a memory configured to store defect data corresponding to the defective overlay image, wherein the first similarity coefficient represents a similarity between a plurality of overlay keys of each of the plurality of target overlay images, wherein the controller is configured to perform preprocessing by:

cropping a dummy area in each of the plurality of target overlay images and the preprocessed normal overlay image, the dummy area being an area other than a region of interest in each of the plurality of target overlay images and the normal overlay image, masking a second overlay key among a first overlay key and the second overlay key of the region of interest, and storing each of the plurality of preprocessed target overlay images and the preprocessed normal overlay image in the memory, wherein a first target overlay image among the plurality of target overlay images comprises an overlay key comprising a first key and a second key, and wherein the controller is further configured to:

determine the first similarity coefficient based on a similarity between the first key and the second key; and determine the first target overlay image as the defective overlay image based on the first similarity coefficient being smaller than a preset first threshold.

11. The overlay measurement device of claim 10, wherein a second similarity coefficient corresponds to a similarity between the normal overlay image and one of the plurality of target overlay images, and wherein the controller is configured to determine the second similarity coefficient based on the plurality of preprocessed target overlay images and the preprocessed normal overlay image.

12. The overlay measurement device of claim 10, wherein a second similarity coefficient corresponds to a similarity between the normal overlay image and one of the plurality of target overlay images, and wherein the controller is configured to:

determine the second similarity coefficient by comparing the preprocessed normal overlay image with a second target overlay image among the plurality of preprocessed target overlay images; and compare the second similarity coefficient with a preset second threshold.

13. The overlay measurement device of claim 12, wherein the controller is configured to determine the second similarity coefficient by comparing a first overlay key of the preprocessed normal overlay image with a first overlay key of the second target overlay image or by comparing a second overlay key of the preprocessed normal overlay image with a second overlay key of the second target overlay image, wherein the controller is configured to determine the first similarity coefficient based on a first horizontal key, a second horizontal key, a first vertical key, and a second vertical key constituting the first overlay key in the first target overlay image, and wherein the first key is the first horizontal key and the second key is the second horizontal key, or the first key is the first vertical key and the second key is the second vertical key.

14. The overlay measurement device of claim 12, wherein the controller is further configured to:

determine the second target overlay image as the defective overlay image based on the second similarity coefficient being less than the preset second threshold.

15. The overlay measurement device of claim 10, wherein the controller is further configured to:

measure an overlay for the overlay measurement target; and generate a final target overlay image excluding the defective overlay image among the plurality of preprocessed target overlay images, and wherein the controller is further configured to measure an overlay based on the final target overlay image.

16. An overlay measurement method comprising:

obtaining a plurality of target overlay images;

determining a first similarity coefficient for each of the plurality of target overlay images;

determining a defective overlay image from among the plurality of target overlay images based on the first similarity coefficient for each of the plurality of target overlay images; and storing a normal overlay image and defect data corresponding to the defective overlay image, wherein the first similarity coefficient corresponds to a similarity between a plurality of overlay keys of each of the plurality of target overlay images, wherein a first target overlay image among the plurality of target overlay images comprises an overlay key comprising a first key and a second key, and wherein the method further comprises:

determining the first similarity coefficient based on a similarity between the first key and the second key; and determining the first target overlay image as the defective overlay image based on the first similarity coefficient being smaller than a preset first threshold.

17. The overlay measurement method of claim 16, wherein a second similarity coefficient corresponds to a similarity between the normal overlay image and one of the plurality of target overlay images, wherein the method further comprises determining the second similarity coefficient, and wherein the determining of the second similarity coefficient further comprises:

performing preprocessing on each of the plurality of target overlay images by:

cropping a dummy area in each of the plurality of target overlay images and the normal overlay image, the dummy area being an area other than a region of interest in each of the plurality of target overlay images and the normal overlay image; and masking a second overlay key among a first overlay key and the second overlay key of the region of interest; and wherein the method further comprises storing each of the plurality of preprocessed target overlay images and the preprocessed normal overlay image in a memory.

18. The overlay measurement method of claim 17, wherein the determining of the second similarity coefficient comprises:

determining the second similarity coefficient based on the plurality of preprocessed target overlay images and the preprocessed normal overlay image.

19. The overlay measurement method of claim 17, further comprising:

comparing the preprocessed normal overlay image with a first second target overlay image among the plurality of preprocessed target overlay images; and comparing the second similarity coefficient with a preset second threshold; and comparing a first overlay key of the preprocessed normal overlay image with a first overlay key of the second target overlay image or comparing a second overlay key of the preprocessed normal overlay image with a second overlay key of the second target overlay image, determining the first similarity coefficient based on a first horizontal key, a second horizontal key, a first vertical key, and a second vertical key in the second target overlay image among the plurality of preprocessed target overlay images; and comparing the first similarity coefficient with the preset first threshold;

wherein the first key is the first horizontal key and the second key is the second horizontal key, or the first key is the first vertical key and the second key is the second vertical key.

* * * * *